(12) United States Patent
Toriya et al.

(10) Patent No.: US 11,466,365 B2
(45) Date of Patent: Oct. 11, 2022

(54) FILM-FORMING APPARATUS

(71) Applicant: TOKYO ELECTRON LIMITED, Tokyo (JP)

(72) Inventors: Daisuke Toriya, Nirasaki (JP); Toshiaki Fujisato, Nirasaki (JP); Yuichi Furuya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 16/456,794

(22) Filed: Jun. 28, 2019

(65) Prior Publication Data

US 2020/0010956 A1 Jan. 9, 2020

(30) Foreign Application Priority Data

Jul. 6, 2018 (JP) .............................. JP2018-129346

(51) Int. Cl.
*C23C 16/46* (2006.01)
*C23C 16/44* (2006.01)
(Continued)

(52) U.S. Cl.
CPC ............ *C23C 16/46* (2013.01); *C23C 16/448* (2013.01); *C23C 16/4411* (2013.01);
(Continued)

(58) Field of Classification Search
CPC ... C23C 14/541; C23C 16/4586; C23C 16/46; C23C 16/463; C23C 16/466;
(Continued)

(56) References Cited

U.S. PATENT DOCUMENTS 5,958,265 A * 9/1999 Ogahara ............. H01L 21/6831
219/121.43
6,221,166 B1 * 4/2001 Nguyen ............... C23C 16/4585
118/725
(Continued)

FOREIGN PATENT DOCUMENTS

JP 2000-25261 A 1/2000
JP 200968037 A 4/2009
(Continued)

*Primary Examiner* — Aiden Lee
(74) *Attorney, Agent, or Firm* — Nath, Goldberg & Meyer; Jerald L. Meyer; Tanya E. Harkins

(57) ABSTRACT

There is provided a film-forming apparatus including: a processing container, wherein a reaction gas is supplied into the processing container; a stage disposed inside the processing container and provided with a substrate heating part, the stage being configured to place a substrate thereon; a support member configured to support the stage from a rear surface of the stage, wherein the rear surface faces a placement surface on which the substrate is placed; a temperature control member disposed on the rear surface of the stage and including a hollow portion formed to cover the support member, the temperature control member configured to have a controllable temperature; a heat-insulating member disposed between the stage and the temperature
(Continued)

control member; and a purge gas supply part configured to supply a purge gas to a first gap formed between the support member and the temperature control member.

12 Claims, 4 Drawing Sheets

(51) Int. Cl.
*H01L 21/687* (2006.01)
*C23C 16/448* (2006.01)

(52) U.S. Cl.
CPC ........ *C23C 16/4412* (2013.01); *C23C 16/466* (2013.01); *H01L 21/68721* (2013.01); *H01L 21/68742* (2013.01)

(58) Field of Classification Search
CPC ............ C23C 16/4585; H01J 37/32724; H01J 2237/2065; H01J 2237/20271; H01L 21/67253; H01L 21/67103; H01L 21/67109; H01L 21/6831; H01L 21/6833; H01L 21/683; H01L 21/687; H01L 21/68721; H01L 21/68728
See application file for complete search history.

(56) References Cited

U.S. PATENT DOCUMENTS

| | | | | |
|---|---|---|---|---|
| 6,413,321 | B1* | 7/2002 | Kim | C23C 16/0209 |
| | | | | 118/719 |
| 6,444,039 | B1* | 9/2002 | Nguyen | C23C 16/455 |
| | | | | 118/715 |
| 7,274,006 | B2* | 9/2007 | Okajima | H01L 21/67103 |
| | | | | 219/465.1 |
| 2007/0254100 | A1* | 11/2007 | Nijhawan | C23C 16/52 |
| | | | | 427/248.1 |
| 2009/0014323 | A1* | 1/2009 | Yendler | H01L 21/67069 |
| | | | | 204/298.33 |
| 2012/0055403 | A1* | 3/2012 | Gomi | C23C 16/4412 |
| | | | | 118/725 |
| 2020/0095680 | A1* | 3/2020 | Satoh | C23C 16/4586 |

FOREIGN PATENT DOCUMENTS

| | | |
|---|---|---|
| JP | 2009218449 A | 9/2009 |
| JP | 2010219354 A | 9/2010 |
| JP | 2011192661 A | 9/2011 |
| KR | 10-2010-0105453 A | 9/2010 |
| KR | 10-2016-0002855 A | 1/2016 |

* cited by examiner

FILM-FORMING APPARATUS

CROSS-REFERENCE TO RELATED APPLICATION

This application is based upon and claims the benefit of priority from Japanese Patent Application No. 2018-129346, filed on Jul. 6, 2018, the entire contents of which are incorporated herein by reference.

TECHNICAL FIELD

The present disclosure relates to a film-forming apparatus.

BACKGROUND

In the manufacture of a semiconductor integrated circuit, a film-forming process is performed by supplying a reaction gas to a substrate such as a semiconductor wafer. Patent Document 1 discloses a technique for supplying a deposition-suppressing gas toward the side of the substrate during the film-forming process to suppress a film from being deposited on places (hereinafter referred to as "unwanted places") other than a front surface of a substrate, for example, an edge portion and a rear surface portion of the substrate, a rear portion and a lateral portion of a stage, or the interior of a processing container.

RELATED ART DOCUMENT

Patent Documents

Japanese Patent Laid-Open Publication No. 2000-025261

SUMMARY

The present disclosure provides a technique capable of suppressing a film from being deposited on unwanted places while suppressing a decrease in temperature of a substrate.

According to an embodiment of the present disclosure, there is provided a film-forming apparatus including: a processing container whose interior is kept in a vacuum atmosphere when performing a film formation, wherein a reaction gas is supplied into the processing container; a stage disposed inside the processing container and provided with a substrate heating part, the stage being configured to place a substrate thereon; a support member configured to support the stage from a rear surface of the stage, wherein the rear surface faces a placement surface on which the substrate is placed; a temperature control member disposed on the rear surface of the stage and including a hollow portion formed to cover the support member, the temperature control member configured to have a controllable temperature; a heat-insulating member disposed between the stage and the temperature control member; and a purge gas supply part configured to supply a purge gas to a first gap formed between the support member and the temperature control member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a film-forming apparatus disclosed herein will be described in detail with reference to the drawings. The film-forming apparatus disclosed herein is not limited by the embodiments. Respective embodiments may be combined unless a conflict arises between processing contents.

A reaction gas used for film formation has a temperature suitable for film formation. For this reason, a film-forming apparatus includes a heater provided in the stage on which a substrate is placed, and heats the substrate using the heater such that a temperature of the substrate becomes the temperature suitable for film formation. Meanwhile, the film-forming apparatus requires cleaning a film deposited on unwanted places in some instances. Thus, the film-forming apparatus suppresses a film from being deposited on places where one wishes to suppress the deposition of the film, such as the periphery of the stage, by cooling down those places. For example, the film-forming apparatus suppresses the deposition of the film by cooling down the processing container and a support member that supports the stage.

However, for example, when the support member is cooled down, the heat of the heater may be radiated to the support member, and thus the temperature of the substrate may decrease. This may result in a reduction in film-forming rate. Therefore, when the temperature of the support member is raised in order to limit the reduction in the film-forming rate, the film is deposited on unwanted places such as the periphery of the stage.

Therefore, it is expected to suppress the deposition of a film on unwanted places while suppressing the decrease in temperature of the substrate.

[Configuration of Film-Forming Apparatus]

Figure 1:
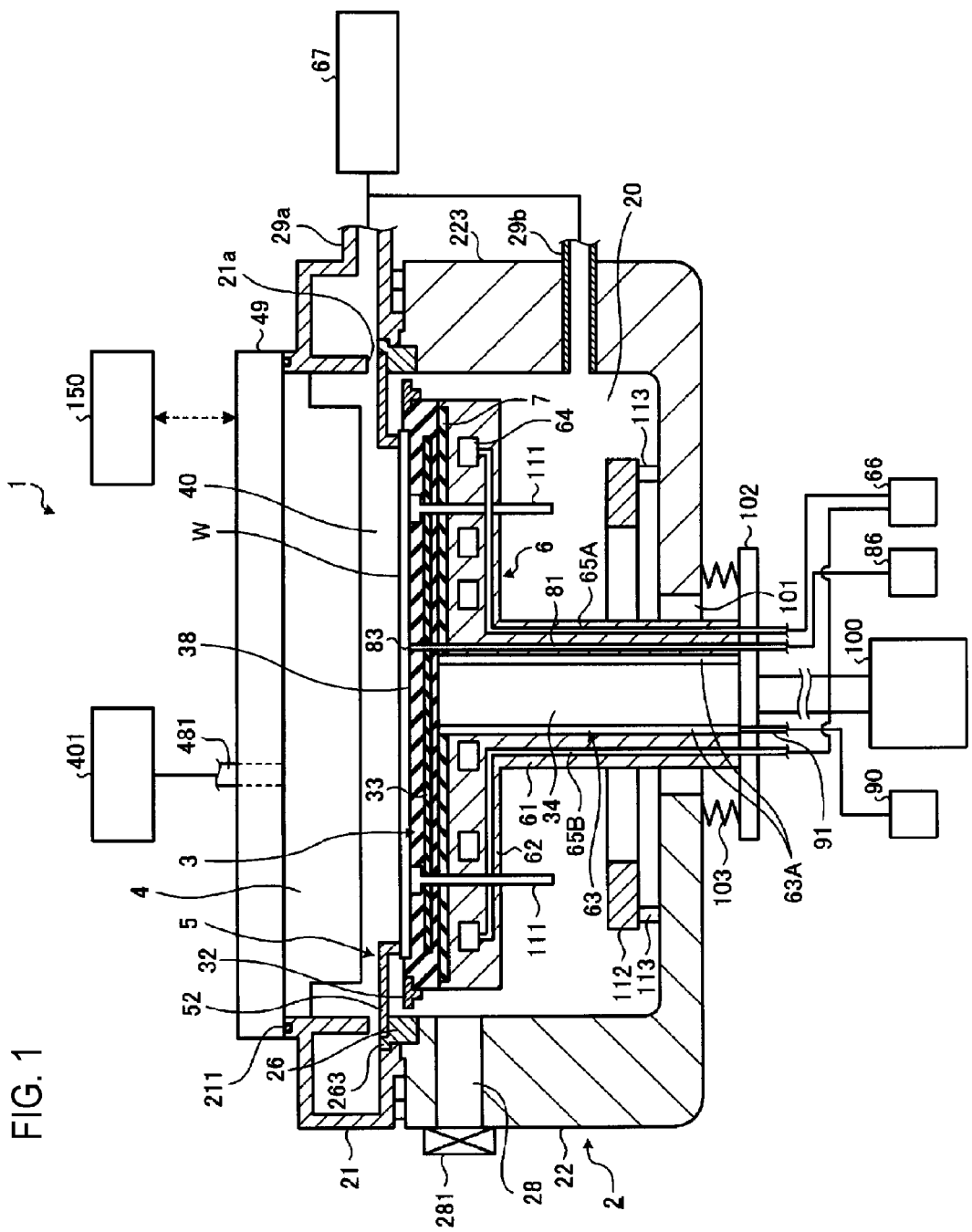
FIG. 1 is a cross-sectional view illustrating an example of a schematic configuration of a film-forming apparatus according to an embodiment.

Next, a configuration of a film-forming apparatus according to an embodiment will be described. Hereinafter, a case in which the film-forming apparatus performs film formation with respect to a semiconductor wafer (hereinafter, referred to as a "wafer") as a substrate will be described by way of an example. FIG. 1 is a cross-sectional view illustrating an example of a schematic configuration of a film-forming apparatus according to an embodiment. The film-forming apparatus 1 includes a processing container 2.

The interior of the processing container 2 is kept in a vacuum atmosphere during film formation. The processing container 2 includes a stage 3 configured to place a wafer W on a placement surface of a recess 38 formed in the stage 3, and a gas ejection mechanism 4 provided above the processing container 2 so as to face the stage 3, which are provided inside the processing container 2. The gas ejection mechanism 4 supplies a gas to the front surface of the wafer W.

The stage 3 is formed in a flat disk shape using, for example, aluminum nitride or quartz as a material. A heater 33 is embedded in the stage 3 as a substrate heating part that heats the wafer W. The heater 33 is formed of, for example, a sheet-shaped resistance heating element, and is supplied with power from a power supply (not illustrated) so as to generate heat. The heater 33 heats the placement surface of the stage 3 so as to heat the wafer W to a predetermined process temperature suitable for film formation. For example, the heater 33 heats the wafer W placed on the stage 3 to, for example, 130 to 250 degrees C.

The stage 3 is supported by a columnar support member 34 at a rear surface of the placement surface on which the wafer W is placed. For example, the stage 3 is supported by the columnar support member 34 at the central portion of a lower surface (the rear surface) of the stage 3.

An annular edge ring 32 is provided at an outer peripheral portion of the stage 3. In addition, a temperature control jacket 6 is provided below the stage 3 as a temperature control member. The temperature control jacket 6 includes a columnar portion 61 having a diameter larger than that of the support member 34, and a flat plate portion 62 having a size similar to that of the stage 3. The columnar portion 61 is formed in a lower portion of the temperature control jacket 6 and the flat plate portion 62 is formed in an upper portion of the temperature control jacket 6. The temperature control jacket 6 further includes a columnar hollow portion 63 having a diameter larger than that of the support member 34, which is formed in the vertical direction in the center of the temperature control jacket 6. The temperature control jacket 6 accommodates the support member 34 in the hollow portion 63, and is disposed so as to cover the support member 34 with the hollow portion 63 and to cover the entire rear surface of the stage 3. The hollow portion 63 has a diameter larger than that of the support member 34. Thus, a gap 63A is formed between the support member 34 and the temperature control jacket 6. The gap 63A may be about 1 mm to 5 mm. In some embodiments, in order to suppress offset between the temperature control jacket 6 and the support member 34, the temperature control jacket 6 and the support member 34 may be in contact with each other in a portion in the circumferential direction. As an example, the columnar portion 61 may include a plurality of protrusions formed on a surface facing the hollow portion 63 in a mutually spaced-apart relationship along the circumferential direction of the columnar portion 61, so that the support member 34 is brought into contact with the columnar portion 61 by the plurality of protrusions.

In the temperature control jacket 6, a coolant flow path 64 is formed inside the flat plate portion 62, and two coolant pipes 65A and 65B are provided inside the columnar portion 61. One end portion of the coolant flow path 64 is connected to the coolant pipe 65A, and the other end portion is connected to the coolant pipe 65B. The coolant pipes 65A and 65B are connected to a coolant unit 66. The coolant unit 66 is, for example, a chiller unit. The coolant unit 66 is configured to be capable of controlling a temperature of the coolant so that the coolant having a predetermined temperature is supplied to the coolant pipe 65A. The coolant is supplied from the coolant unit 66 to the coolant flow path 64 through the coolant pipe 65A. The coolant supplied to the coolant flow path 64 returns to the coolant unit 66 via the coolant pipe 65B. The temperature control jacket 6 is configured to be capable of controlling the temperature of the coolant by circulating the coolant, such as cooling water through the coolant flow path 64.

A heat-insulating ring 7 as a heat-insulating member is disposed between the stage 3 and the temperature control jacket 6. The heat-insulating ring 7 is formed in a disk shape using, for example, SUS316, A5052, Ti (titanium), ceramic or the like.

Figure 2:
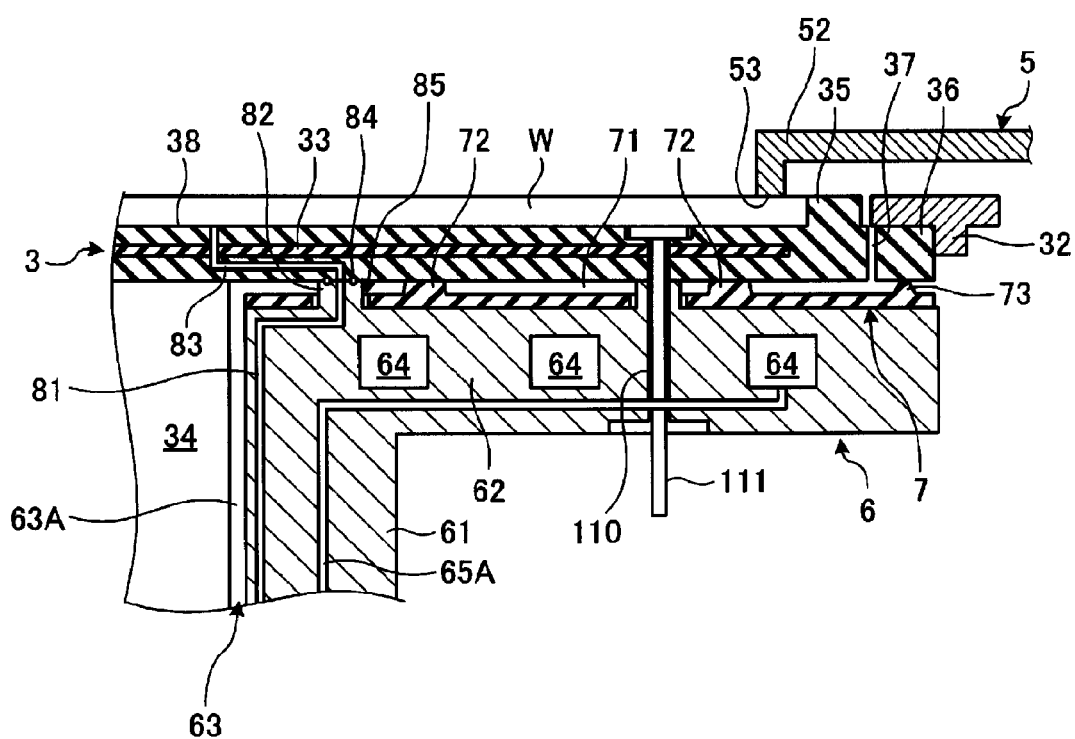
FIG. 2 is an enlarged view illustrating an example of a configuration in the vicinity of a stage according to an embodiment.

FIG. 2 is an enlarged view illustrating an example of a configuration in the vicinity of a stage 3 according to an embodiment. A gap 71 is formed between the heat-insulating ring 7 and the stage 3 in the entire circumferential direction so that the hollow portion 63 and an edge portion of the temperature control jacket 6 are in communication with each other. For example, the heat-insulating ring 7 has a plurality of protrusions 72 formed on the upper surface thereof to face the stage 3. In addition, the heat-insulating ring 7 has a seal 73 such as, for example, a metal seal, which is formed along the edge portion of the upper surface.

In the stage 3, an upwardly-protruded portion 35 is formed circumferentially along the entire periphery of the stage 3 outside the placement surface on which the wafer W is placed (i.e., outside the recess 38). The edge ring 32 is disposed on an outer peripheral portion 36 that is formed outside the upwardly-protruded portion 35 of the stage 3. The edge ring 32 is engaged with the outer peripheral portion 36.

In the stage 3, through-holes 37 are formed inward of the seal 73 to penetrate the placement surface and the rear surface of the stage 3. In the present embodiment, a plurality of through-holes 37 are formed circumferentially along the entire periphery of the stage 3 in the vicinity of a boundary between the outer peripheral portion 36 and the upwardly-protruded portion 35.

Figure 3:
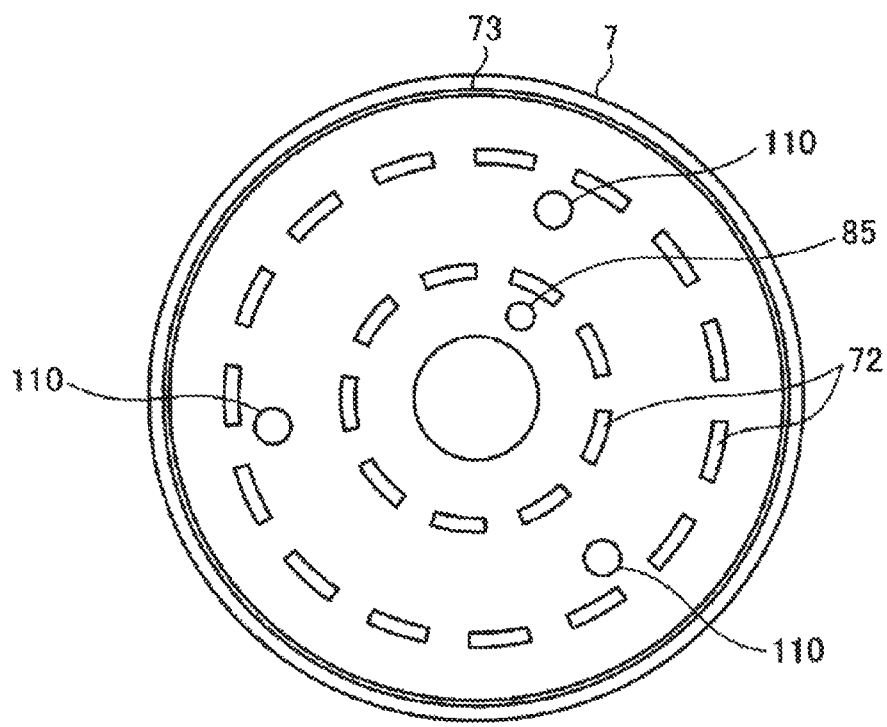
FIG. 3 is a plan view illustrating an example of a configuration of a heat-insulating member according to an embodiment.

FIG. 3 is a plan view illustrating an example of a configuration of the heat-insulating ring 7 according to the embodiment, which illustrates the heat-insulating ring 7 when viewed from the top side thereof. On the heat-insulating ring 7, a plurality of protrusions 72 is formed in two rows which are concentrically aligned with each other. In addition, the seal 73 is formed circumferentially along the peripheral portion of the heat-insulating ring 7. In some embodiments, the protrusions 72 of at least one row may be arranged in a concentric relationship with each other.

As illustrated in FIG. 2, the heat-insulating ring 7 is in contact with the stage 3 at the plurality of protrusions 72. The gap 71 is formed between the heat-insulating ring 7 and the stage 3 in a portion other than the protrusions 72.

A gas supply line for supplying a heat transfer gas to the placement surface of the stage 3 is provided in the stage 3 and the temperature control jacket 6. For example, the temperature control jacket 6 is provided with a gas pipe 81 inside the flat plate portion 62 and the columnar portion 61. One end of the gas pipe 81 reaches an upper surface of the flat plate portion 62. In the temperature control jacket 6, a protrusion 82 is formed on a portion of the flat plate portion 62 in which the one end of the gas pipe 81 is disposed. The protrusion 82 is in contact with the stage 3. The stage 3 includes a gas pipe 83 provided therein. One end of the gas pipe 83 reaches the placement surface. The other end of the gas pipe 83 reaches a position facing the one end of the gas pipe 81 in the protrusion 82. A seal 84, for example, an O-ring, is provided on the protrusion 82 to prevent the heat transfer gas from leaking outward. As illustrated in FIG. 3, the heat-insulating ring 7 has a through-hole 85 formed at a position corresponding to the protrusion 82 so as not to interfere with the protrusion 82.

As illustrated in FIG. 1, the other end of the gas pipe 81 reaches a lower surface of the columnar portion 61, and is connected to a heat transfer gas supply part 86. The heat transfer gas supply part 86 supplies the heat transfer gas, for example, a He gas, to the gas pipe 81. The heat transfer gas supplied from the heat transfer gas supply part 86 to the other end of the gas pipe 81 reaches the one end of the gas pipe 81, flows to the other end of the gas pipe 83, and is supplied from the one end of the gas pipe 83 onto the placement surface of the stage 3.

As illustrated in FIG. 1, a purge gas supply part 90 is provided below the stage 3 and the temperature control jacket 6. The purge gas supply part 90 supplies a purge gas (for example, a nitrogen gas or CO gas) to the gap 63A defined between the support member 34 and the temperature control jacket 6 through the gas pipe 91.

The support member 34 and the temperature control jacket 6 are configured to be raised or lowered by a lift mechanism 100. For example, the support member 34 and the columnar portion 61 of the temperature control jacket 6 penetrate a through-hole 101 formed in a bottom of the processing container 2 to be connected to a lift plate 102. The lift plate 102 and a lower container 22 are air-tightly joined with each other by a bellows 103. The lift plate 102 is raised or lowered by the lift mechanism 100. By raising or lowering the support member 34 and the temperature control jacket 6 by the lift mechanism 100, the stage 3 can be raised or lowered between a delivery position at which the wafer W is delivered between the stage 3 and an external wafer transfer mechanism (not illustrated) and a processing position at which the wafer W is processed.

As illustrated in FIGS. 2 and 3, a plurality of pin holes 110 are formed to penetrate the stage 3, the temperature control jacket 6, and the heat-insulating ring 7 in the vertical direction. For example, three pin holes 110 are formed at equal intervals in the circumferential direction of the placement surface to penetrate the stage 3, the temperature control jacket 6, and the heat-insulating ring 7 in the vertical direction. For example, lift pins 111 made of, for example, quartz, are inserted into the respective pin holes 110 so as to be movable in the vertical direction. In FIG. 1, only two lift pins 111 are illustrated. The lift pins 111 are biased downward by springs (not illustrated) or the like provided in the respective pin holes 110. As illustrated in FIG. 1, in a state in which the stage 3 is moved to the processing position of the wafer W, lower end portions of the lift pins 111 protrude from the bottom surface of the temperature control jacket 6, and upper flat end portions thereof are engaged with the upper surface of the stage 3 so that the lift pins 111 are accommodated in the respective pin holes 110.

Figure 4:
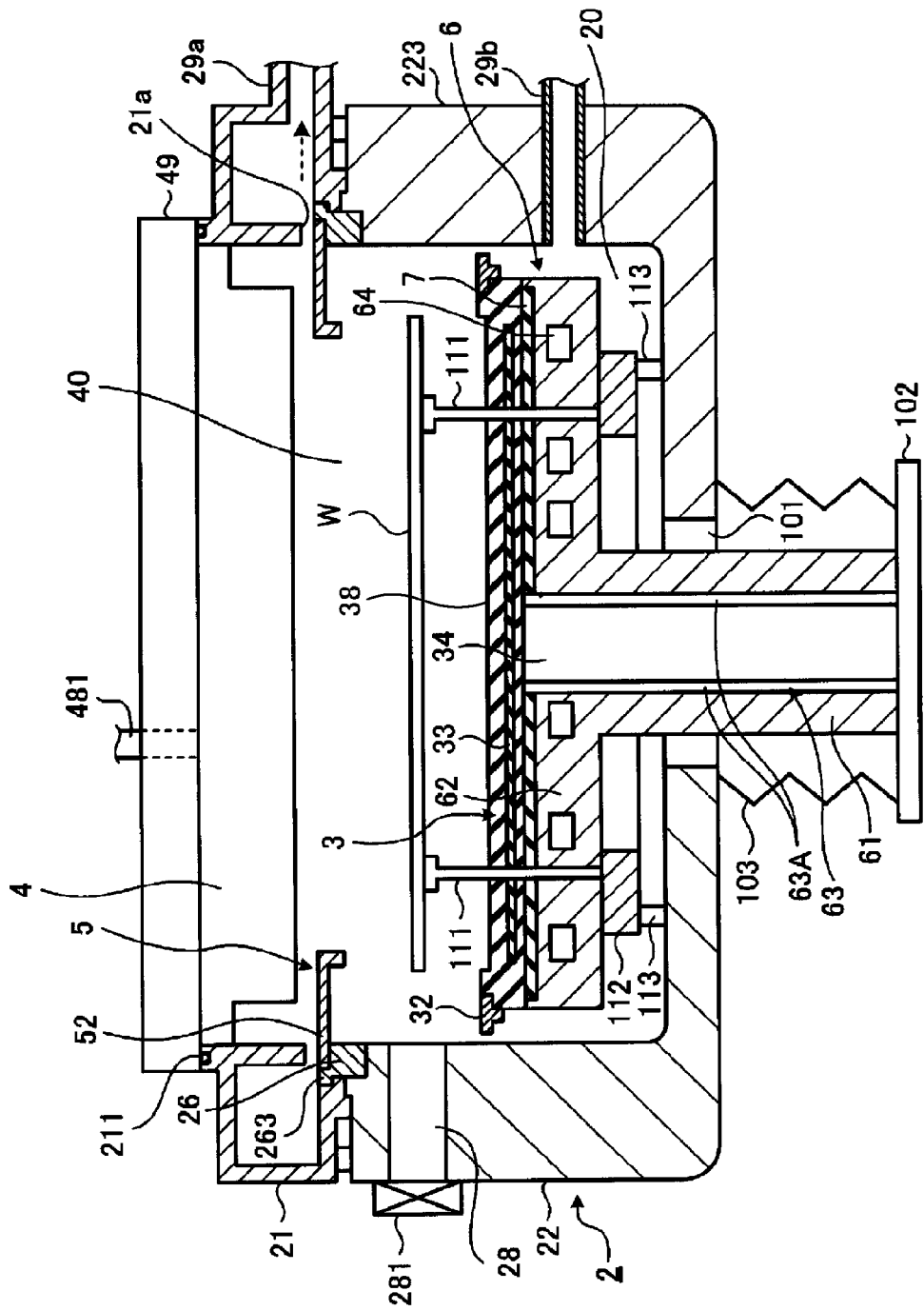
FIG. 4 is a view illustrating an example of a state in which the stage of the film-forming apparatus according to the embodiment is lowered to a wafer delivery position.

A ring-shaped lift member 112 is provided below each of the lift pins 111. The lift member 112 is fixed to the bottom surface of the lower container 22 by a support part 113. When the stage 3 is lowered to the delivery position of the wafer W, lower surfaces of the lift pins 111 are in contact with the lift member 112 so that the lift pins 111 are pushed up from the stage 3. FIG. 4 is a view illustrating an example of the state in which the stage 3 of the film-forming apparatus 1 according to the embodiment is lowered to the delivery position of the wafer W. When the lift plate 102 lowers the stage 3 to the delivery position of the wafer W, each of the lift pins 111 is pushed up so that the wafer W supported by the lift pins 111 is raised from the placement surface of the stage 3.

The processing container 2 has a configuration in which an exhaust duct 21 formed in an annular shape is stacked on the lower container 22 of a flat bowl-shape. For example, the lower container 22 is made of aluminum or the like, and the above-mentioned through-hole 101 is formed in the bottom surface of the lower container 22.

A loading/unloading port 28 is formed in the sidewall portion 223 of the lower container 22. A gate valve 281 is provided in the loading/unloading port 28. The loading/unloading port 28 is opened or closed by the gate valve 281. The wafer W is loaded into or unloaded from the loading/unloading port 28 by a wafer transfer mechanism such as an external transfer arm.

For example, the exhaust duct 21 is configured as an annular body that is formed by bending an angular duct made of aluminum. The exhaust duct 21 constitutes a portion of the processing container 2 by being stacked on the lower container 22. A slit 21a is formed in the exhaust duct 21 along an inner circumferential surface to make a circulation conductance smaller. This makes it possible to uniformly exhaust a processing space 40 in the circumferential direction of the processing container 2. An exhaust pipe 29a is connected to an outer wall surface of the exhaust duct 21. In addition, an exhaust pipe 29b is connected to the sidewall portion 223 of the lower container 22. An exhaust mechanism 67 including a vacuum pump, a pressure control valve, or the like is connected to the exhaust pipe 29a and the exhaust pipe 29b. The interior of the processing container 2 can be evacuated using the exhaust mechanism 67 connected to the exhaust pipe 29a and the exhaust pipe 29b.

The processing container 2 is provided with an inner ring 26 as a surrounding member that surrounds the stage 3 at the processing position and divides the interior of the processing container 2 into the processing space 40 as an upper space and a bottom area 20 as a lower space. The inner ring 26 is a ring-shaped member formed of, for example, aluminum. The inner ring 26 is formed in a shape that can be provided between an inner wall surface of the sidewall portion 223 of the lower container 22 and a lateral peripheral surface of the stage 3. A flange portion 263 is formed on an outer peripheral portion of an upper surface of the inner ring 26 so as to expand outward. The inner ring 26 is disposed inside the processing container 2 in a state in which the flange portion 263 is engaged with the exhaust duct 21. In some embodiments, an upper surface of the inner ring 26 may be covered with, for example, a ring cover made of quartz.

A clamp ring 5 is provided on an upper surface of the inner ring 26. The clamp ring 5 is formed in an annular shape, and is disposed inside the processing container 2 in a state in which a lower surface of the clamp ring 5 is placed on the inner ring 26. In the clamp ring 5, an annular inner peripheral portion 52 extends more inward than an inner peripheral surface of the inner ring 26. An inner end of the inner peripheral portion 52 is located above a peripheral portion of the wafer W placed on the stage 3. For example, a flat contact portion 53 is formed on a lower surface of the inner end of the inner peripheral portion 52. When the stage 3 is raised to the processing position at which the wafer W is processed by the lift mechanism 100, the contact portion 53 of the clamp ring 5 is brought into contact with the entire peripheral portion of the wafer W placed on the stage 3 so that the clamp ring 5 presses the wafer W. Although in this embodiment, the contact portion 53 have been described to have a flat surface, the present disclosure is not limited thereto.

In some embodiments, the clamp ring 5 may be made of a metal such as aluminum or a ceramic such as alumina. The clamp ring 5 may have a weight sufficient to press the contact portion 53 against the wafer W placed on the stage 3 so as to suppress the reaction gas from flowing around the clamp ring 5. As an example, the clamp ring 5 may have a weight ranging from several hundred grams to several kilograms. In some embodiments, the inner ring 26 may include a pre-heating part such as a heater configured to preheat the inner ring 26 itself and the clamp ring 5.

The gas ejection mechanism 4 is supported by a support member 49 at an upper surface thereof. The processing container 2 is sealed by closing an opening formed at the side of an upper surface of the exhaust duct 21 with the support member 49. An O-ring 211 is provided between the exhaust duct 21 and the support member 49 to air-tightly maintain the interior of the processing container 2.

The gas ejection mechanism 4 supported by the support member 49 is disposed such that the bottom surface thereof faces the upper surface of the stage 3. The support member 49 is provided with a supply pipe that supplies a reaction gas for film formation to the gas ejection mechanism 4. The film-forming apparatus 1 according to the embodiment will be described by taking, as an example, a case where a ruthenium film is formed using, for example, a ruthenium precursor as the reaction gas. A ruthenium gas supply pipe 481 as a supply pipe for supplying a reaction gas is provided in the support member 49. A ruthenium gas supply part 401 is provided at the upstream side of the ruthenium gas supply pipe 481. The ruthenium gas supply part 401 includes a raw material tank for storing a ruthenium precursor, a carrier gas supply mechanism for supplying the ruthenium gas, a flow rate control part, and the like.

The gas ejection mechanism 4 ejects the ruthenium gas supplied from the ruthenium gas supply pipe 481. The ruthenium gas thus ejected undergoes reaction in the processing space 40 between the gas ejection mechanism 4 and the stage 3 so that a ruthenium film is formed on the wafer W.

The operation of the film-forming apparatus 1 configured as above is entirely controlled by a controller 150. The controller 150 is, for example, a computer, and includes a central processing unit (CPU), a random access memory (RAM), a read only memory (ROM), an auxiliary storage device, and the like. The CPU operates based on a program stored in the ROM or the auxiliary storage device or a process condition of film formation so as to control the entire operation of the apparatus. For example, the controller 150 controls the supply operation of the reaction gas and the like from the ruthenium gas supply part 401, the lifting operation of the stage 3, and the exhaust operation of the processing container 2 performed by the exhaust mechanism 67. The controller 150 also controls the heating operation by the heater 33, the supply operation of the coolant by the coolant unit 66, and the supply operation of the purge gas by the purge gas supply part 90. In addition, the computer-readable program necessary for control may be stored in a storage medium. The storage medium may include a flexible disk, a compact disc (CD), a CD-ROM, a hard disk, a flash memory, a DVD, or the like. In addition, the controller 150 may be provided inside or outside the film-forming apparatus 1. In the case where the controller 150 is provided outside the film-forming apparatus 1, the controller 150 may control the film-forming apparatus 1 in a wired or wireless communication mechanism.

Next, a film-forming process executed by the film-forming apparatus 1 under the control of the controller 150 will be described. In the film-forming apparatus 1, the exhaust mechanism 67 is operated to depressurize the interior of the processing container 2 to have a vacuum atmosphere. In the film-forming apparatus 1, when loading the wafer W, the stage 3 is lowered to the delivery position as illustrated in FIG. 4, and the gate valve 281 is opened. The wafer W is placed on the placement surface of the stage 3 by the wafer transfer mechanism through the loading/unloading port 28. In the film-forming apparatus 1, the gate valve 281 is closed, and the stage 3 is raised to the processing position.

After an internal pressure of the processing container 2 is adjusted, the film-forming apparatus 1 supplies the reaction gas into the processing container 2 to perform the film-forming process on the wafer W. For example, in the film-forming apparatus 1, the ruthenium gas is supplied from the ruthenium gas supply part 401 to the gas ejection mechanism 4, so that the ruthenium gas is ejected from the gas ejection mechanism 4. The ruthenium gas ejected from the gas ejection mechanism 4 undergoes reaction in the processing space 40 between the gas ejection mechanism 4 and the stage 3 so that a ruthenium film is formed on the wafer W.

The reaction gas used for film formation has a temperature suitable for film formation. Therefore, the film-forming apparatus 1 controls a power supply (not illustrated) to supply power to the heater 33 before the film-forming process so that the wafer W is heated to a predetermined process temperature suitable for film formation by the heater 33. For example, in the film-forming apparatus 1, the wafer W is heated to 250 degrees C. Further, in the film-forming apparatus 1, coolant is supplied from the coolant unit 66 to cool down the temperature control jacket 6. This suppresses deposition of a film. For example, in the film-forming apparatus 1, the temperature of the coolant supplied from the coolant unit is controlled such that the temperature control jacket 6 is controlled to have a predetermined temperature lower than the process temperature. For example, in order to suppress the deposition of a film, the film-forming apparatus 1 controls the temperature control jacket 6 to have a temperature of 80 degrees C.

When the temperature control jacket 6 is cooled down in this way, in the film-forming apparatus 1, the heat of the heater 33 is absorbed by the temperature control jacket 6, and thus the temperature of the wafer W may be reduced and the film-forming rate may be reduced.

However, the film-forming apparatus 1 according to the embodiment includes the heat-insulating ring 7 disposed between the stage 3 and the temperature control jacket 6. The heat-insulating ring 7 suppresses the heat of the heater 33 from being radiated to the temperature control jacket 6. Thus, the film-forming apparatus 1 can suppress the reduction in the film-forming rate even when the temperature control jacket 6 is cooled down. Moreover, since the film-forming apparatus 1 can cool down the temperature control jacket 6, it is possible to suppress a film from being deposited on the temperature control jacket 6.

In addition, the gap 71 is formed between the heat-insulating ring 7 according to the embodiment and the stage 3 in the entire circumferential direction so that the hollow portion 63 and the peripheral portion of the temperature control jacket 6 are in communication with each other. In the film-forming apparatus 1 according to the embodiment, the purge gas is supplied to the gap 63A between the support member 34 and the temperature control jacket 6 from the purge gas supply part 90 through the gas pipe 91. The purge gas may be continuously supplied from before the film-forming process and during the film-forming process, or may be continuously supplied from a time point when the wafer W is placed on the stage 3. The purge gas supplied from the purge gas supply part 90 flows upward along the gap 63A, and reaches the gap 71 between the heat-insulating ring 7 and the stage 3. Then, the purge gas diffuses in the entire circumferential direction of the stage 3 by the gap 71 and is ejected from each through-hole 37 so as to be supplied around the placement surface of the stage 3. The purge gas supplied around the placement surface of the stage 3 flows to the exhaust pipe 29a through a gap between the clamp ring 5 and the inner ring 26 or a gap between the clamp ring 5 and the wafer W, or flows to the exhaust pipe 29b through a gap between the clamp ring 5 and the edge ring 32, thereby being exhausted.

In the film-forming apparatus 1, the radiation of heat between the heat-insulating ring 7 and the stage 3 is suppressed by the gap 71, which enhances the heat-insulating efficiency by the heat-insulating ring 7. Thus, according to the film-forming apparatus 1, it is possible to suppress a reduction in the film-forming rate even when the temperature control jacket 6 is cooled down. With the film-forming apparatus 1, it is possible to suppress a film from being deposited around the placement surface of the stage 3 by supplying the purge gas around the placement surface of the stage 3. In addition, the film-forming apparatus 1 supplies the purge gas, thus suppressing the entrance of a film-forming gas into each of the through-holes 37 and the gap 71. It is therefore possible to suppress a film from being deposited on each of the through-holes 37 and the gap 71. In some embodiments, the film-forming apparatus 1 may supply the purge gas to the peripheral portion of the stage 3 through the gap 63A and the gap 71 without having to use a gas supply line for the purge gas.

As described above, the film-forming apparatus 1 according to the present embodiment includes the processing container 2, the stage 3, the support member 34, the temperature control jacket 6 as a temperature control member, the heat-insulating ring 7 as a heat-insulating member, and the purge gas supply part 90. The interior of the processing container 2 is kept in a vacuum atmosphere when the film formation is performed and the reaction gas is supplied into the processing container 2. The stage 3 is disposed inside the processing container 2 and includes the heater 33 as a substrate-heating part. The wafer W as a substrate is placed on the stage 3. The support member 34 supports the stage 3 at the rear surface opposite the placement surface on which the wafer W is placed. The temperature control jacket 6 is provided with the hollow portion 63 which covers the support member 34, and is disposed on the rear surface of the stage 3 so that the temperature of the temperature control jacket 6 can be controlled. The heat-insulating ring 7 is disposed between the stage 3 and the temperature control jacket 6. The purge gas supply part 90 supplies the purge gas to the gap 63A formed between the support member 34 and the temperature control jacket 6. Thus, in the film-forming apparatus 1, it is possible to suppress a film from being deposited on unwanted places while suppressing a reduction in temperature of the wafer W.

In addition, the gap 71 is formed between the heat-insulating ring 7 according to the embodiment and the stage 3 in the entire circumferential direction so that the hollow portion 63 and the edge portion of the temperature control jacket 6 are in communication with each other. Thus, in the film-forming apparatus 1, the radiation of heat between the heat-insulating ring 7 and the stage 3 is suppressed, which enhances the heat-insulating efficiency by the heat-insulating ring 7. In addition, in the film-forming apparatus 1, since the purge gas is supplied around the stage 3 through the gap 71, it is possible to suppress the deposition of a film.

In addition, the heat-insulating ring 7 according to the present embodiment includes the plurality of protrusions 72 formed thereon to face the stage 3. The plurality of protrusions 72 are circumferentially arranged in at least one row at intervals along the circumferential direction of the heat-insulating ring 7 so that they are brought into contact with the stage 3. Thus, in the film-forming apparatus 1, it is possible to stably arrange the stage 3 on the heat-insulating ring 7. In addition, in the film-forming apparatus 1, it is possible to form the gap 71 on the surface facing the stage 3 in the heat-insulating ring 7 in the entire circumferential direction.

In addition, the heat-insulating ring 7 includes the seal 73 that is formed along the peripheral portion of the surface facing the stage 3 in the heat-insulating ring 7. The plurality of through-holes 37 penetrating the placement surface and the rear surface of the stage 3 are formed along the seal 73 inward of the position at which the seal 73 is formed. Thus, in the film-forming apparatus 1, it is possible to directly supply the purge gas to the peripheral portion of the placement surface of the stage 3, which makes it possible to suppress a film from being deposited on the peripheral portion of the placement surface.

In addition, the temperature control jacket 6 according to the present embodiment includes the flow path formed therein to supply coolant, and includes an inlet and an outlet through which the coolant can circulate. Thus, in the film forming apparatus 1, it is possible to suppress a film from being deposited below the stage 3 by circulating the coolant through the temperature control jacket 6 and cooling down the temperature control jacket 6.

The temperature control jacket 6 according to the present embodiment includes the gas pipe 81 as a flow path formed therein to supply a heat transfer gas. One end of the gas pipe 81 is connected to the heat transfer gas supply part 86, and the other end of the gas pipe 81 is connected to the gas pipe 83 as a heat transfer gas supply hole formed in the rear surface of the stage 3. The seal 84 is provided around the gas pipe 81. Thus, in the film-forming apparatus 1, it is possible to supply the heat transfer gas from the lower portion of the temperature control jacket 6 to the stage 3 through the gas pipe 83.

In addition, the heat-insulating ring 7 according to the present embodiment includes the plurality of protrusions 72 formed thereon and the seal 73 formed along the peripheral portion thereof. The temperature control jacket 6 is brought into contact with the rear surface of the stage 3 through the plurality of protrusions 72 so that the gap 71 is formed between the rear surface of the stage 3 and the temperature control jacket 6. Thus, in the film-forming apparatus 1, it is possible to supply the purge gas through the gap 71 without having to use a gas pipe for the purge gas.

In addition, in the film-forming apparatus 1 according to the present embodiment, the gap 63A and the gap 71 are in communication with each other. The purge gas supplied from the purge gas supply part 90 is supplied to the plurality of through-holes 37 formed in the stage 3 through the gap 63A and the gap 71. Thus, in the film-forming apparatus 1, it is possible to supply the purge gas to the stage 3 without having to use a gas pipe for the purge gas.

In addition, the film-forming apparatus 1 according to the present embodiment further includes the clamp ring 5 which is formed in an annular shape and is in contact with a portion inwardly positioned than the periphery of the wafer W. A space is formed by the clamp ring 5 and the peripheral portion of the stage 3, and the purge gas is supplied into the space through the plurality of through-holes 37 of the stage 3. Thus, in the film-forming apparatus 1, it is possible to suppress a film from being deposited on the peripheral portion of the stage 3.

Although the embodiment has been described above, it should be understood that the embodiment disclosed herein is illustrative and non-restrictive in all respects. Indeed, the embodiment described above may be implemented in various forms. In addition, the embodiments described above may be omitted, replaced, or modified in various forms without departing from the scope and spirit of the claims.

For example, in the embodiment, the case where a ruthenium precursor is used as the reaction gas for film formation has been described by way of an example, but the present disclosure is not limited thereto. The reaction gas may be any gas as long as it is a gas used to form a film on a substrate.

In addition, in the embodiment, the case where the purge gas is caused to flow through the gap 63A between the support member 34 and the temperature control jacket 6 has been described by way of an example, but the present disclosure is not limited thereto. For example, a groove may be vertically formed on a surface facing the hollow portion 63 in the support member 34, or a surface at the side of the hollow portion 63 in the temperature control jacket 6, and the purge gas may be circulated through the groove.

In the embodiment, the case where the seal 73 is provided at the peripheral portion of the heat-insulating ring 7, the through-holes 37 are formed in the stage 3, and the purge gas is supplied to the periphery of the placement surface of the stage 3 through the through-holes 37 has been described by way of an example, but the present disclosure is not limited thereto. For example, the purge gas may be supplied around a lateral surface of the stage 3 from a gap between the stage 3 and the heat-insulating ring 7 without having to use the seal 73.

According to the present disclosure, it is possible to suppress a film from being deposited on unwanted places.

What is claimed is:

1. A film-forming apparatus comprising:
a processing container whose interior is kept in a vacuum atmosphere when performing a film formation, wherein a reaction gas is supplied into the processing container;
a stage disposed inside the processing container and provided with a substrate heating part, the stage being configured to place a substrate thereon;
a support member configured to support the stage from a rear surface of the stage, wherein the rear surface is an opposite side of a placement surface on which the substrate is placed;
a temperature control member disposed on the rear surface of the stage and including a hollow portion formed to cover the support member, the temperature control member configured to have a controllable temperature;
a heat-insulating member having a disk shape and disposed between the stage and the temperature control member; and
a purge gas supply part configured to supply a purge gas to a first gap formed between the support member and the temperature control member,
wherein the temperature control member includes a columnar portion formed in a lower portion of the temperature control member, a flat plate portion formed in an upper portion of the temperature control member, a flow path formed inside the flat plate portion, and a first coolant pipe and a second coolant pipe provided inside the columnar portion and connected to a coolant unit,
wherein a coolant is supplied from the coolant unit to the flow path through the first coolant pipe, and the coolant supplied to the flow path returns to the coolant unit through the second coolant pipe, and wherein the stage includes:
an upwardly-protruded portion formed to protrude upward from the stage and formed circumferentially along an entire outer periphery of the stage outside the placement surface;
a recess on which the substrate is mounted and that is formed in the placement surface of the stage and positioned inward of the upwardly-protruded portion;
an outer peripheral portion positioned outward of the upwardly-protruded portion; and
a plurality of through-holes that are formed in a vicinity of a boundary between the outer peripheral portion and the upwardly-protruded portion.

2. The film-forming apparatus of claim 1, wherein the heat-insulating member includes a gap formed between the heat-insulating member and the stage in an entire circumferential direction, wherein the gap and the hollow portion of the temperature control member are in communication with each other.

3. The film-forming apparatus of claim 2, wherein the heat-insulating member includes a seal formed along a peripheral portion of a surface of the heat-insulating member that faces the stage, and
wherein the plurality of through-holes is formed along the seal and inward of a position at which the seal is formed to penetrate the placement surface and the rear surface in a peripheral portion of the stage.

4. The film-forming apparatus of claim 3, wherein the gap and the plurality of through-holes are in communication with each other.

5. The film-forming apparatus of claim 1, wherein the heat-insulating member includes a plurality of protrusions formed on a surface of the heat-insulating member that faces the stage, the plurality of protrusions being concentrically arranged in at least one row at intervals along a circumferential direction of the heat-insulating member so that the protrusions are brought into contact with the stage.

6. The film-forming apparatus of claim 1, wherein the heat-insulating member includes a seal formed along a peripheral portion of a surface of the heat-insulating member that faces the stage, and
wherein the plurality of through-holes is formed along the seal to penetrate the placement surface and the rear surface and formed inward of a position at which the seal is formed.

7. The film-forming apparatus of claim 1, wherein the temperature control member further includes an inlet, an outlet, and the coolant circulating through the flow path.

8. The film-forming apparatus of claim 1, wherein the temperature control member includes a flow path to which a heat transfer gas is supplied, one end of the flow path to which the heat transfer gas is supplied being connected to a heat transfer gas supply source, and the other end of the flow path to which the heat transfer gas is supplied being connected to a heat transfer gas supply hole formed in the rear surface of the stage, a seal member being provided around the other end of the flow path to which the heat transfer gas is supplied.

9. The film-forming apparatus of claim 1, wherein the heat-insulating member includes a plurality of protrusions formed thereon and a seal provided along a peripheral portion of the heat-insulating member, the plurality of protrusions being brought into contact with the rear surface of the stage, a second gap being formed between the rear surface of the stage and the heat-insulating member.

10. The film-forming apparatus of claim 9, wherein the first gap and the second gap are in communication with each other, and the purge gas supplied from the purge gas supply part is supplied to the plurality of through-holes provided in the stage through the first gap and the second gap.

11. The film-forming apparatus of claim 1, further comprising:
- a clamp ring formed in an annular shape, the clamp ring being brought into contact with a portion inwardly positioned than a peripheral portion of the substrate,
- wherein a space is formed by the clamp ring and a peripheral portion of the stage, and the purge gas is supplied to the space through the plurality of through-holes in the stage.

12. The film-forming apparatus of claim 1, wherein the heat-insulating member is made of SUS316, titanium or ceramic.

* * * * *